US012658887B2

(12) United States Patent
Kobayashi et al.

(10) Patent No.: US 12,658,887 B2
(45) Date of Patent: Jun. 16, 2026

(54) VIBRATION ELEMENT AND METHOD OF MANUFACTURING VIBRATION ELEMENT

(71) Applicant: SEIKO EPSON CORPORATION, Tokyo (JP)

(72) Inventors: Takuro Kobayashi, Minowa-machi (JP); Keiichi Yamaguchi, Ina (JP); Ryuta Nishizawa, Nagano (JP)

(73) Assignee: SEIKO EPSON CORPORATION, Tokyo (JP)

( * ) Notice: Subject to any disclaimer, the term of this patent is extended or adjusted under 35 U.S.C. 154(b) by 886 days.

(21) Appl. No.: 17/983,639

(22) Filed: Nov. 9, 2022

(65) Prior Publication Data

US 2023/0145942 A1     May 11, 2023

(30) Foreign Application Priority Data

Nov. 11, 2021     (JP) ................................. 2021-183881

(51) Int. Cl.
 *H03H 9/215* (2006.01)
 *H03H 3/02* (2006.01)
 *H03H 9/05* (2006.01)
 *H03H 9/13* (2006.01)

(52) U.S. Cl.
 CPC .............. *H03H 9/215* (2013.01); *H03H 3/02* (2013.01); *H03H 9/0547* (2013.01); *H03H 9/13* (2013.01); *H03H 2003/026* (2013.01)

(58) Field of Classification Search
 CPC ........ H03H 9/215; H03H 9/0547; H03H 9/13; H03H 9/131; H03H 9/1021; H03H 2003/026; H03H 3/02
 See application file for complete search history.

(56) References Cited

U.S. PATENT DOCUMENTS

2014/0241132 A1* 8/2014 Tamura .................... H03H 9/21
                                                          331/116 R
2019/0149091 A1* 5/2019 Hosaka .................... H03B 5/32
                                                          29/593

FOREIGN PATENT DOCUMENTS

| JP | 2004-363980 A | 12/2004 |
|----|---------------|---------|
| JP | 2013-157908 A | 8/2013 |
| JP | 2014-192647 A | 10/2014 |
| JP | 2016-208324 A | 12/2016 |

* cited by examiner

*Primary Examiner* — Emily P Pham

(74) *Attorney, Agent, or Firm* — Rankin, Hill & Clark LLP

(57) ABSTRACT

A vibration element includes a vibrating part, and a support part which is coupled to the vibrating part to support the vibrating part, wherein the vibrating part and the support part have a first surface and a second surface having a front and back relationship with the first surface, a first electrode is disposed on the first surface, the first electrode includes a first layer as a foundation layer, and a second layer as an upper layer of the first layer, when performing zoning into a first area where the first electrode is not disposed, a second area where the first layer and the second layer are stacked on one another, and a third area where the first layer is formed, identification symbols formed of two or more of the first to third areas are disposed, and an identification code formed of a plurality of the identification symbols is provided.

7 Claims, 18 Drawing Sheets

START

FORM FIRST LAYER ~S10

FORM SECOND LAYER
(FORM SECOND AREA) ~S11

FORM FIRST AREA ~S12

FORM THIRD AREA ~S13

END

VIBRATION ELEMENT AND METHOD OF MANUFACTURING VIBRATION ELEMENT

The present application is based on, and claims priority from JP Application Serial Number 2021-183881, filed Nov. 11, 2021, the disclosure of which is hereby incorporated by reference herein in its entirety.

BACKGROUND

1. Technical Field

The present disclosure relates to a vibration element and a method of manufacturing a vibration element.

2. Related Art

There has been known that an identification code is attached to a vibration element in order to ensure traceability of a waster and so on in a manufacturing process. In, for example, JP-A-2004-363980 (Document 1), there is disclosed forming an identification code formed of Arabic numerals on an extraction electrode of a quartz crystal element.

Further, in, for example, JP-A-2013-157908 (Document 2), there is disclosed forming an identification code formed of a bar-code or the like on a surface of a base of a tuning-fork vibration piece. According to Document 2, the identification code is, for example, a matrix-type two-dimensional code or a one-dimensional code, and has information unique to the piezoelectric vibration piece such as a variety of types of manufacturing information such as a manufacturing number, a manufacturing year, and a manufacturing plant, or information for identifying a state in the manufacturing process and so on. Further, in, for example, FIG. 5 in Document 2, there is illustrated an appearance in which the identification code having a square shape is formed on the base of the tuning-fork vibration piece.

However, in either of the technologies in Document 1 and Document 2, there is a problem that it is difficult to dispose an identification code easy to discriminate in a given space which is made small due to reduction is size of the element. In particular, in the case of the identification code formed of numbers in Document 1, some numerals such as 6 and 8 are blurred to be difficult to discriminate.

Further, in Document 2, it is difficult to form the one-dimensional code or the two-dimensional code in a recognizable size in the given small space.

In other words, there has been demanded a vibration element provided with an identification symbol which can be formed in a small space and which is easy to discriminate.

SUMMARY

A vibration element according to the present disclosure includes a vibrating part, and a support part which is coupled to the vibrating part to support the vibrating part, wherein the vibrating part and the support part have a first surface and a second surface having a front and back relationship with the first surface, a first electrode is disposed on the first surface, the first electrode includes a first layer as a foundation layer, and a second layer as an upper layer of the first layer, when performing zoning into a first area in which the first electrode is not disposed, a second area in which the first layer and the second layer are stacked on one another, and a third area in which the first layer is formed, identification symbols formed of two or more of the first area, the second area, and the third area are disposed, and an identification code formed of a plurality of the identification symbols is provided.

A method of manufacturing a vibration element according to the present disclosure includes forming a first layer to be a foundation layer on a first surface in a vibrating part and a support part configured to support the vibrating part, stacking a second layer on the first layer to form a second area to be an electrode, forming a first area from which the electrode is removed, and removing the second layer from the electrode to form a third area in which the first layer is exposed, wherein an identification code in which identification symbols of two or more of the first area through the third area are arranged is formed.

BRIEF DESCRIPTION OF THE DRAWINGS

FIG. 13 is a manufacturing process diagram in the d-d cross-section in FIG. 9.

FIG. 14 is a cross-sectional view of an identification symbol in a modified example.

FIG. 24 is a plan view showing an aspect of a vibration element.

DESCRIPTION OF EXEMPLARY EMBODIMENTS

Embodiment 1

Schematic Configuration of Vibrator Device

Figure 1:
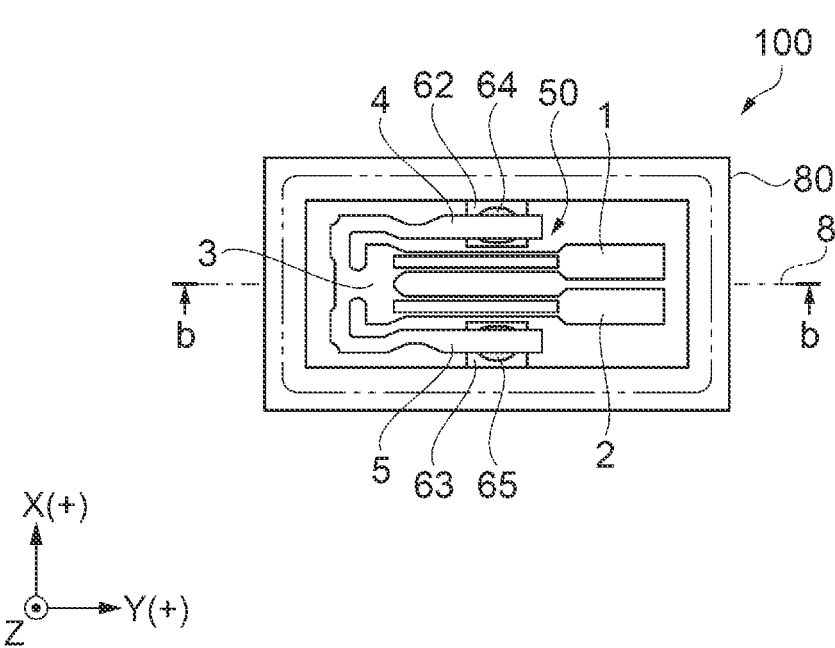
FIG. 1 is a transmissive plan view of a vibrator device according to Embodiment 1.
Figure 2:
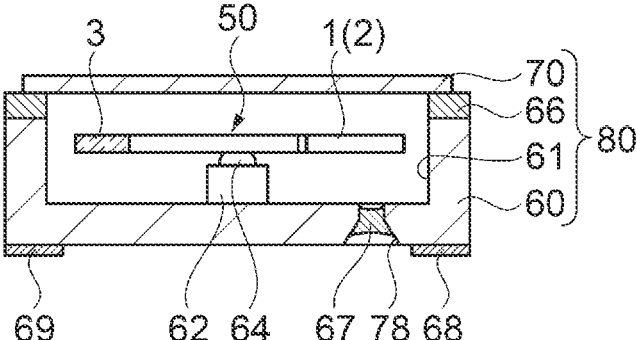
FIG. 2 is a cross-sectional view of the vibrator device in a b-b cross-section in FIG. 1.
Figure 2:
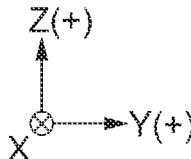

FIG. 1 is a plan view showing a configuration of a vibrator device according to the present embodiment. FIG. 2 is a cross-sectional view in a b-b cross-section in FIG. 1. The b-b cross-section is a cross-section in a centerline 8 in a plan view of the vibrator device 100.

The vibrator device 100 is constituted by a package 80, a vibration element 50, and the like housed in the package 80. It should be noted that FIG. 1 is a transmissive view, and illustrates an inside of the package 80 in a see-through manner. In a preferred example, the vibration element 50 is a tuning-fork quartz crystal vibration element, and the vibrator device 100 is a quartz crystal oscillator. It should be noted that it is possible to provide an oscillation circuit in the package 80, and the oscillation circuit is provided in a bottom portion of a base 60 in the preferred example, but is not shown in the drawings.

It should be noted that in each of the drawings, there are shown an X axis, a Y axis, and a Z axis as three axes perpendicular to each other for the sake of convenience of explanation. Further, the arrow side of each of the axes is also referred to as a positive side, and the opposite side is also referred to as a negative side. Further, the positive side in the Z-axis direction is also referred to as an "upper side," the negative side is also referred to as a "lower side," but regarding an object to be stacked such as an electrode disposed on a surface crossing the Z axis, a layer more distant from the surface is referred to as an "upper layer" regardless of the positive side and the negative side. Further, a plan view viewed from the Z-axis direction is also referred to simply as a "plan view."

As shown in FIG. 2, the package 80 is constituted by the base 60 provided with a recess 61 opening on an upper surface, a lid 70 as a lid body for closing the opening of the recess 61, and so on. The lid 70 is bonded to the base 60 via a bonding member 66 as a seal ring disposed along an upper surface of a sidewall surrounding the recess 61. In the preferred example, the base 60 is formed of ceramics such as alumina, and the lid 70 is formed of a metal material such as Kovar. In the preferred example, the lid 70 and the bonding member 66 are bonded to each other with seam welding. It should be noted that these materials are not a limitation, and for example, the lid 70 can be formed using a glass material.

In the inside of the package 80, there is formed a space by the recess 61, and the vibration element 50 is housed in that space. The vibration element 50 is supported by a pair of protrusions 62, 63 disposed in the recess 61 so as to be able to vibrate. In particular, the vibration element 50 is supported by a pair of support arms 4, 5 of the vibration element 50 being bonded to the protrusions 62, 63 with coupling pads 64, 65, respectively. Thus, as shown in FIG. 2, the vibration element 50 is fixed in a state in which the vibrating arms 1, 2 of the vibration element 50 can vibrate in the space of the recess 61.

The coupling pads 64, 65 are electrically coupled to the oscillation circuit (not shown). The oscillation circuit is electrically coupled to coupling terminals 68, 69 on a bottom surface of the package 80. It should be noted that the details of the vibration element 50 will be described later.

The bottom portion of the base 60 is provided with a through hole 78. The vibration element 50 and so on are housing in the recess 61, and the lid 70 is bonded to the base 60, and then the package 80 is put into a reduced-pressure atmosphere. Further, in the reduced-pressure environment, the through hole 78 is filled with a sealing material 67 made of a metal material or the like. Thus, the inside of the package 80 is sealed in a state of keeping the reduced-pressure atmosphere. It should be noted that the reduced-pressure environment is not a limitation, and it is possible to adopt an atmosphere obtained by encapsulating an inert gas such as nitrogen or Ar.

Structure of Vibration Element

Figure 3:
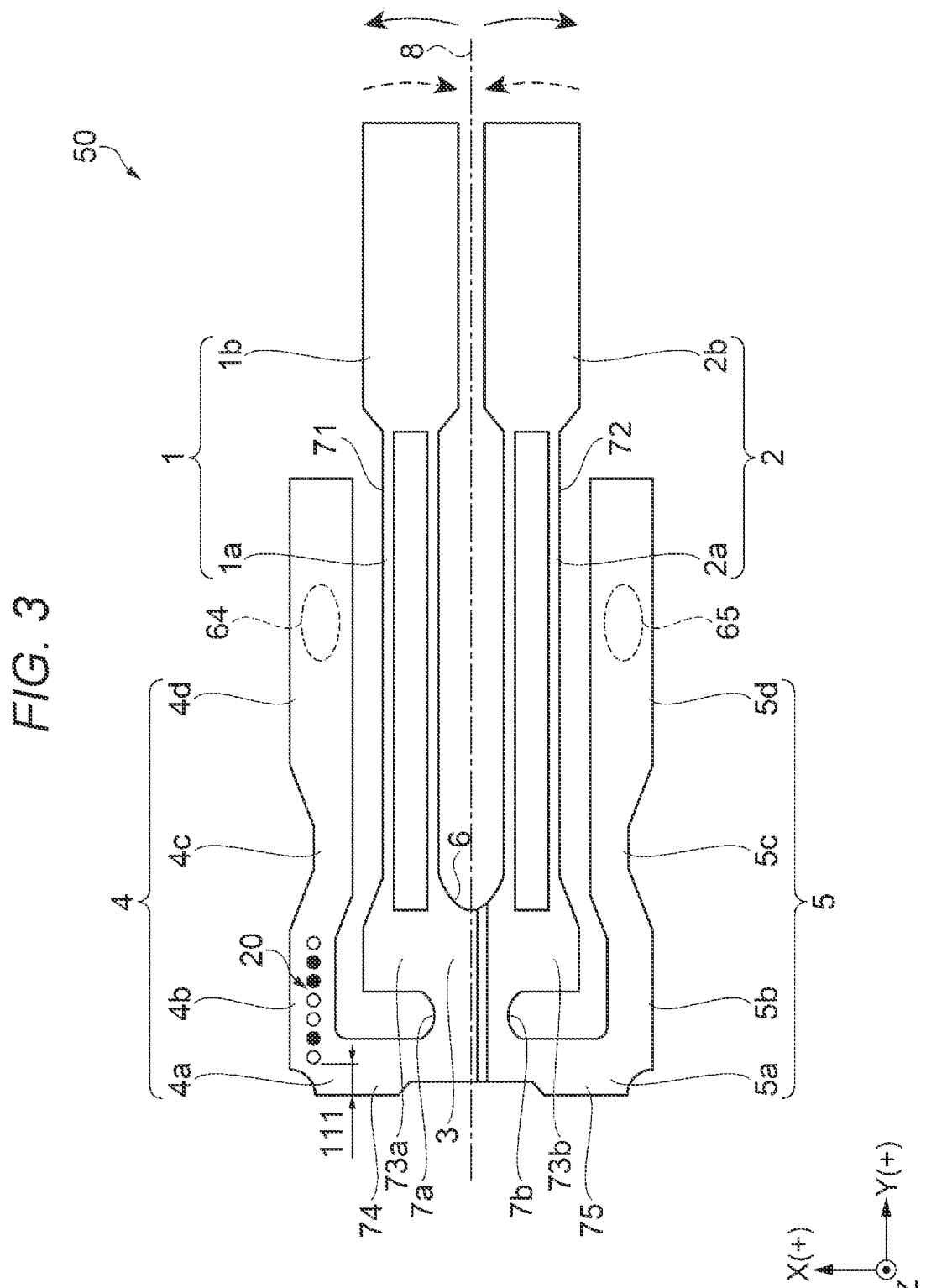
FIG. 3 is a plan view of a vibration element.

FIG. 3 is a plan view of the vibration element 50.

As shown in FIG. 3, the vibration element 50 is constituted by the pair of vibrating arms 1, 2 as vibrating parts, a base 3, the pair of support arms 4, 5, and so on.

The vibrating arm 1 extends from the base 3 toward the positive Y direction, and is constituted by an arm part 1a located at the base side and coupled to the base 3, and a weight part 1b located at a terminal side. Similarly, the vibrating arm 2 also extends from the base 3 toward the positive Y direction, and is constituted by an arm part 2a located at the base side and coupled to the base 3, and a weight part 2b located at a terminal side. In other words, the vibrating arm 2 has a configuration line symmetric with the vibrating arm 1 taking the centerline 8 as an axis of symmetry. The vibrating arms 1, 2 are branched into two branches by a cut-out part 6 of the base 3, and a tuning-fork vibration piece is constituted by the vibrating arms 1, 2.

An upper surface of the arm part 1a having a prismatic shape is provided with a bottomed groove. Similarly, a lower surface of the arm part 1a is also provided with a bottomed groove. Thus, the cross-section of the arm part 1a has a cross-sectional configuration having a substantially H shape. The same applies to the arm part 2a. It should be noted that the upper surface corresponds to a first surface, and the lower surface corresponds to a second surface. The weight part 1b is wider in width than the arm part 1a, and is disposed at a tip side of the arm part 1a. The same applies to the weight part 2b.

The support arm 4 is a support arm for supporting the base 3 and the vibrating arms 1, 2, and is constituted by an arm part 4a, an arm part 4b, an arm part 4c, and an arm part 4d. The arm part 4a is branched from a cut-out part 7a of the base 3 to project toward the positive X direction, and is then folded at a substantially right angle to be coupled to the arm part 4b extending toward the positive Y direction. The arm part 4c is a coupling portion between the arm part 4b and the arm part 4d, and is formed thinner in width than the arm part 4d extending toward the positive Y direction. Further, the arm part 4c is substantially the same in width as the arm part 4d, but is slightly inflected in a coupling part to the arm part 4b.

The support arm 5 is also a support arm for supporting the base 3 and the vibrating arms 1, 2, and is constituted by an arm part 5a, an arm part 5b, an arm part 5c, and an arm part 5d. The arm part 5a, the arm part 5b, the arm part 5c, and the arm part 5d have configurations line symmetric with the arm part 4a, the arm part 4b, the arm part 4c, and the arm part 4d, respectively, taking the centerline 8 as an axis of symmetry.

As described above, the vibration element 50 is provided with a configuration in which the support arms 4, 5 are folded at both sides of the base 3 to extend along the extending directions of the vibrating arms 1, 2 to thereby achieve a vibration piece small in size and compact.

Further, the base 3 and the pair of support arms 4, 5 are collectively referred to as a support part. In other words, the support part is a region which is coupled to the vibrating arms 1, 2 as the vibrating part to support the vibrating part.

Further, an excitation electrode 71 is disposed on an upper surface and side surfaces of the arm part 1*a* of the vibrating arm 1. The excitation electrode 71 is electrically coupled to the coupling pad 64 on a lower surface of the support arm 4 via an extraction electrode 73*a* on an upper surface of the base 3 and an extraction electrode 74 on an upper surface of the support arm 4. Similarly, an excitation electrode 72 is disposed on an upper surface and side surfaces of the arm part 2*a* of the vibrating arm 2. The excitation electrode 72 is electrically coupled to the coupling pad 65 on a lower surface of the support arm 5 via an extraction electrode 73*b* on the upper surface of the base 3 and an extraction electrode 75 on an upper surface of the support arm 5. In other words, the excitation electrodes 71, 72 are provided to the vibrating arms 1, 2 as the vibrating part, the extraction electrodes 73*a*, 73*b* are provided to the base 3 as the support part, and the extraction electrodes 74, 75 are provided to the support arms 4, 5 as the support part. It should be noted that the extraction electrodes 73*a*, 73*b*, 74, and 75 correspond to support part electrodes.

According to this vibration element 50, when a drive signal is supplied from an outside via the coupling pads 64, 65, a drive voltage is applied to the excitation electrodes 71, 72 of the vibrating arms 1, 2, and the vibrating arms 1, 2 make flexural vibrations at a predetermined frequency so as to repeat getting closer to each other and getting away from each other as indicated by the arrows.

It should be noted that the weight parts 1*b*, 2*b* of the vibrating arms 1, 2 are each provided with a metal film for adjusting a vibration state, but the illustration is omitted.

Further, the arm part 4*b* of the support arm 4 is provided with an identification code 20. The identification code 20 is identification information unique to the vibration element 50 in the manufacturing process, and unique identification information of the vibration element 50 such as a manufacturing device which manufactures the vibration element 50, a production lot, a manufacturing data, manufacturing time, and a manufacturing number. Thus, when a waster in the manufacturing process occurs, it becomes possible to trace a feature of the vibration element 50 back to a wafer state from the identification code.

Details of Identification Code

Figure 4:
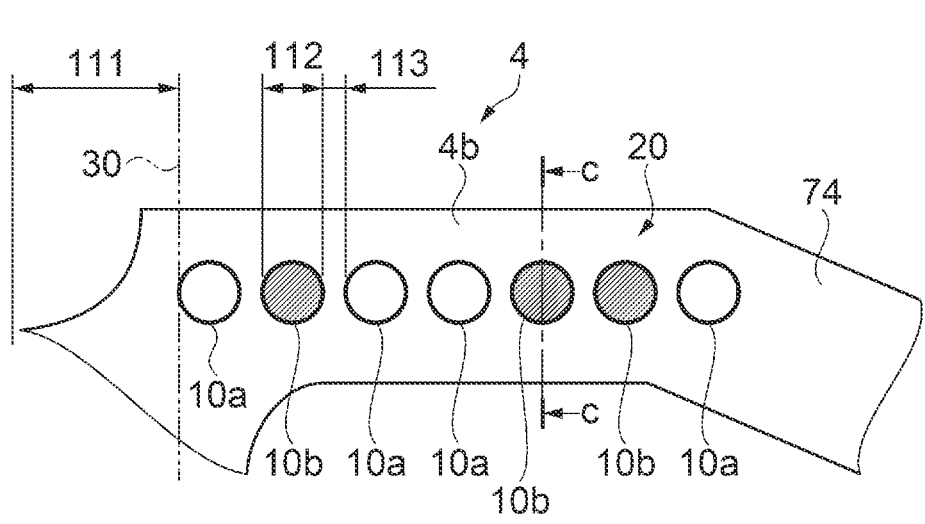
FIG. 4 is an enlarged view of an arm portion of a support arm.
Figure 4:
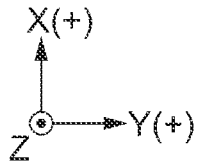

FIG. 4 is an enlarged view of the vicinity of the arm part 4*b* of the support arm 4.

The identification code 20 in FIG. 4 is constituted by a plurality of identification symbols 10*a*, 10*b* arranged along an extending direction of the arm part 4*b* of the support arm 4.

The identification symbol 10*b* is a portion of the arm part 4*a* where the extraction electrode 74 is removed in a circle, and is formed using a photolithography technology. Similarly, the identification symbol 10*a* is formed by removing only an outline portion of a circle from the extraction electrode 74. The identification symbol 10*a* and the identification symbol 10*b* are the same in diametrical size as each other.

The identification symbol 10*a* and the identification symbol 10*b* are identification symbols of patterns reversed from each other, and for example, the identification symbol 10*a* represents "0," and the identification symbol 10*b* represents "1." In other words, it is possible to describe a binary number with the identification symbol 10*a* and the identification symbol 10*b*. It should be noted that it is possible for the identification symbol 10*a* to represent "1," and it is possible for the identification symbol 10*b* to represent "0."

In the identification code 20, seven digits of identification symbols are arranged in a line in the order of the identification symbol 10*a*, the identification symbol 10*b*, the identification symbol 10*a*, the identification symbol 10*a*, the identification symbol 10*b*, the identification symbol 10*b*, and the identification symbol 10*a*. In other words, the identification code 20 represents "0100110" as a binary number, which represents 38 as a decimal number. As described above, in the identification code 20, it is possible to describe identification codes from 0 to 127. It should be noted that the seven digits are not a limitation, but it is possible to arbitrarily set the number of digits in accordance with a necessary amount of information.

It is possible to recognize the identification code 20 with a known image recognition technology using an imaging camera. In a preferred example, as shown in FIG. 3, since a position at a distance of a dimension 111 from an outer shape in a negative Y direction of the vibration element 50 is defined as a start position 30 of the identification code 20, it is possible to perform an image recognition of the identification code 20 from the start position 30 with reference to the outer shape of the vibration element 50. Alternatively, it is possible to take an image of the whole of the arm part 4*b* to extract the seven-digit identification symbol by the image recognition.

It should be noted that although in the identification code 20, there are used the reverse patterns each having a circular shape as the identification symbols, but this is not a limitation, and it is sufficient to adopt identification symbols of patterns reversed from each other, and it is possible to use, for example, a polygonal shape such as a triangle or a quadrangle, a star shape, or a crisscross shape.

In the preferred example, the identification symbols 10*a*, 10*b* are arranged at a regular pitch, and a size 112 of the identification symbol 10*b* is no smaller than 1 μm and no larger than 80 μm, and a gap 113 between the identification symbols adjacent to each other is made no smaller than 1 μm and no larger than 150 μm. This is because when the size of the identification symbol is smaller than 1 μm, it is difficult to form the identification symbol, and when the size of the identification symbol is larger than 80 μm, it becomes unachievable for the identification symbol to fall within a formation space such as an arm part 4*b*. Further, this is because when the size of the gap 113 is smaller than 1 μm, there is a possibility that the identification symbols adjacent to each other overlap each other, and when the gap 113 is larger than 150 μm, it becomes unachievable for the identification code to fall within the formation space such as an arm part 4*b*.

Figure 5:
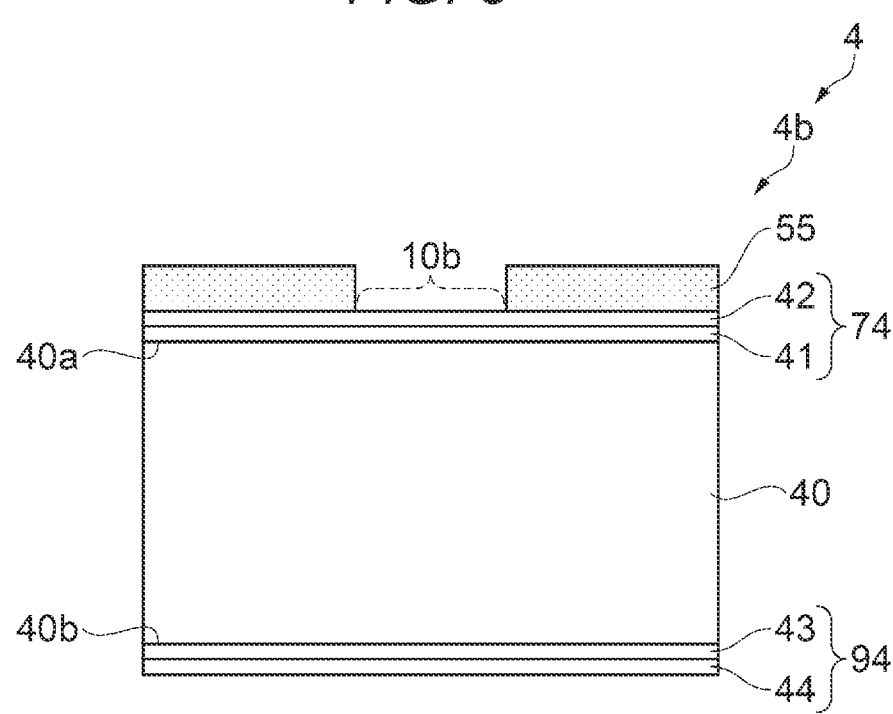
FIG. 5 is a manufacturing process diagram of an identification symbol in a c-c cross-section in FIG. 4.
Figures 6, 7:
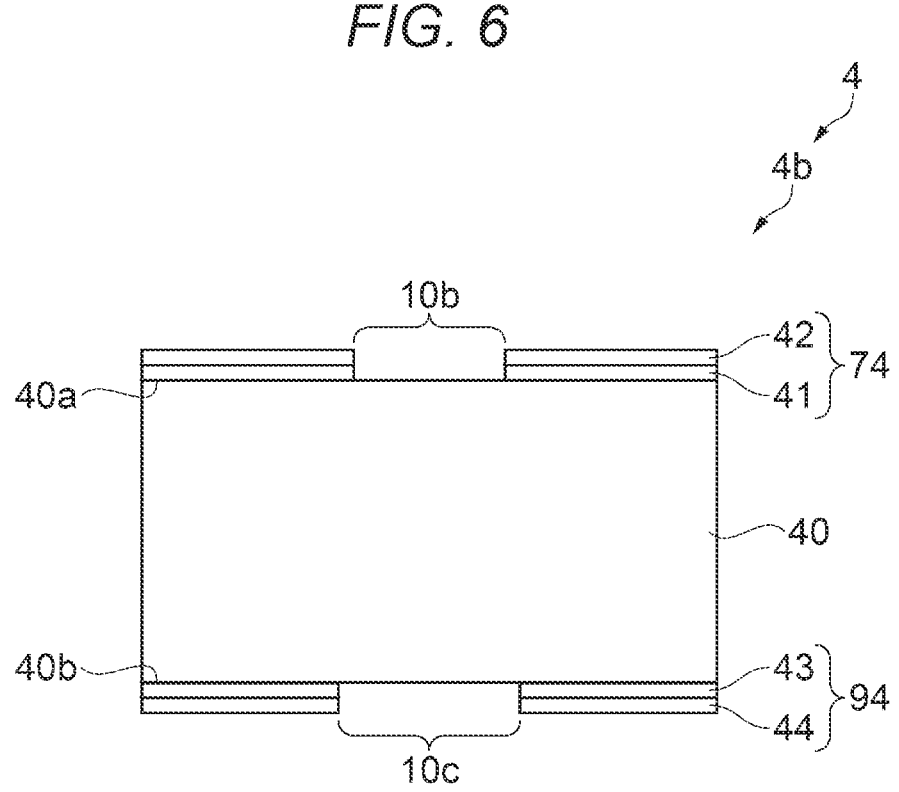
FIG. 6 is a cross-sectional view of an aspect in the c-c cross-section in FIG. 4.
FIG. 7 is an enlarged view of the arm portion of the support arm in a different aspect.

FIG. 5 is a cross-sectional view in a c-c cross-section in FIG. 4, and is a diagram showing a manufacturing process of the identification symbol. FIG. 6 is a cross-sectional view in the c-c cross-section in FIG. 4.

Then, a method of forming the identification symbol 10*b* will be described.

As shown in FIG. 5, on an upper surface 40*a* of a base member 40 to be the base of the vibration element 50, there is formed the extraction electrode 74 as the support part electrode. In the preferred example, the base member 40 is a quartz crystal substrate. The extraction electrode 74 has a stacked structure of two layers with a foundation electrode 41 and an upper electrode 42. In the preferred example, chromium is used as the foundation electrode 41, and gold is used as the upper electrode 42. It should be noted that this is not a limitation, and it is possible to use a metal material such as platinum (Pt), aluminum (Al), aluminum alloy, silver (Ag), silver alloy, chromium (Cr), chromium alloy, copper (Cu), molybdenum (Mo), niobium (Nb), tungsten (W), iron (Fe), titanium (Ti), cobalt (Co), zinc (Zn), zirconium (Zr), or nickel (Ni), or an electrically-conductive material such as indium tin oxide (ITO). It should be noted that a method of forming the extraction electrode 74 will be described later. Further, an extraction electrode 94 is formed also on a lower surface 40*b* of the base member 40 similarly to the upper surface 40*a* side. The extraction electrode 94 is also provided with the two-layer structure with a foundation electrode 43 and an upper electrode 44, which are the same in material as the foundation electrode 41 and the upper electrode 42.

First, as shown in FIG. 5, on the extraction electrode 74, there is formed a resist 55 in which portions to be the identification symbols 10*b* are opened.

Then, by performing etching processing using the resist 55 as a mask, the extraction electrode 74 is removed from the portions to be the identification symbols 10*b*. Subsequently, the resist 55 is removed.

Thus, the identification symbols 10*b* from which the surface of the base member 40 is exposed are provided to the arm part 4*b* of the support arm 4 as shown in FIG. 6. In the preferred example, since gold on the surface of the extraction electrode 74 and a quartz crystal surface in the identification symbols 10*b* are different in color tone, reflectance, and so on, it is possible to surely perform the image recognition on the identification symbols 10*b*.

Further, as shown in FIG. 6, it is possible to provide an opening 10*c* to the extraction electrode 94 at the lower surface 40*b* side of the base member 40 at a reverse side of the identification symbol 10*b*. As a method of forming the opening 10*c*, it is possible to use the same formation method as that for the identification symbol 10*b*. It should be noted that it is preferable to make the opening 10*c* one-size larger in diameter than the identification symbol 10*b*.

According to the above, due to a light transmissive property of quartz crystal, when observing the identification symbol 10*b* from the upper surface 40*a* side of the base material 40, the color tone, the reflectance, and so on become different compared to when the opening 10*c* does not exist. Therefore, since it becomes possible to use the identification symbol 10*b* without the opening 10*c* and the identification symbol 10*b* with the opening 10*c* as the identification symbols different from each other, it becomes possible to describe a ternary number. In other words, the identification code includes two or more types of identification symbols. Further, the base member 40 has the upper surface 40*a* as a first surface, and the lower surface 40*b* as a second surface opposed to the first surface, the extraction electrode 74 on the upper surface 40*a* is provided with the identification symbol 10*b*, and in a portion of the lower surface 40*b* overlapping the identification symbol 10*b* on the upper surface 40*a*, there is disposed the opening 10*c*, but no electrode is disposed.

Modified Examples

FIG. 7 is an enlarged view of the vicinity of the arm part 4*b* of the support arm 4 in a modified example, and corresponds to FIG. 4.

In an identification code 21 shown in FIG. 7, an unpatterned portion of the surface of the extraction electrode 74 is used as an identification symbol 10*d* representing "0" instead of the identification symbol 10*a* (FIG. 4). Further, a start line 31 is formed along the start position 30. The start line 31 is a portion which is formed by removing the extraction electrode 74, and in which the base member 40 is exposed similarly to the identification symbol 10*b*. In these points, the identification code 21 is different from the identification code 20 shown in FIG. 4.

Since the identification symbols of the identification code 21 are arranged at regular pitch similarly to the identification code 20, even the unpatterned identification symbol 10*d* functions as the identification symbol. In detail, when the number of digits of the identification code 21, and the arrangement pitch of the identification symbols are known in advance, by performing the image recognition on the portion corresponding to the setting position from the start line 31, it is possible to perform the image recognition in which the identification symbols 10*b* is recognized as "1," and the unpatterned identification symbol 10*d* portion is recognized as "0."

It should be noted that it is not required to dispose the start line 31, and as described above, it is sufficient to recognize the start position based on the outer shape of the vibration element 50. Further, as described with reference to FIG. 6, it is possible to use an identification symbol obtained by providing the opening 10*c* to the identification symbol 10*b* in addition to the identification symbol 10*b*. According to the above, it becomes possible to describe a ternary number.

Figure 8:
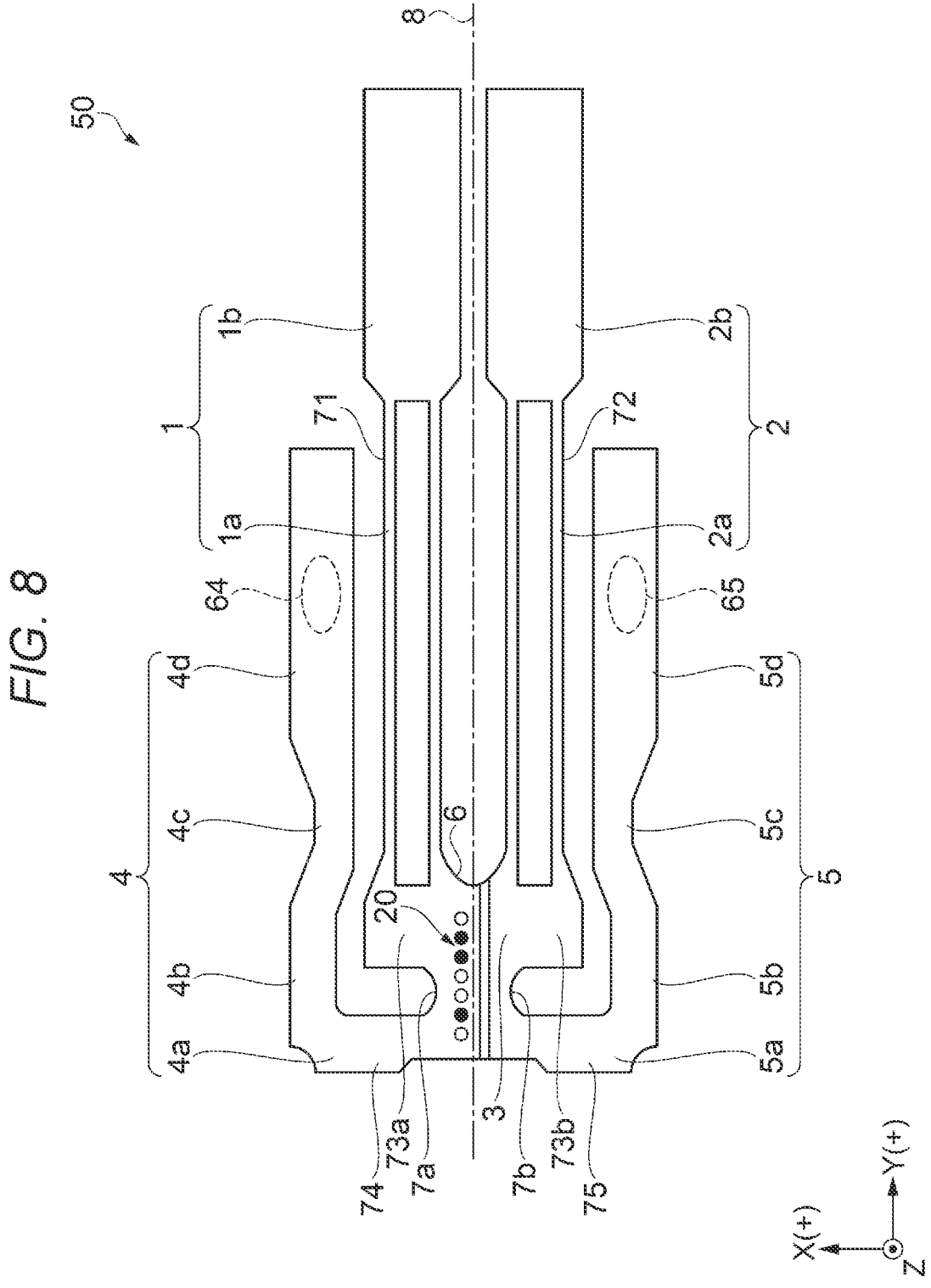
FIG. 8 is a plan view of the vibration element in a different aspect.

FIG. 8 is a plan view of the vibration element 50 in the modified example.

In the vibration element 50 shown in FIG. 8, the identification code 20 is provided to the base 3. In detail, the identification code 20 is provided to the extraction electrode 73*a* as the support part electrode of the base 3. In other words, the identification code 20 is provided to the extraction electrode 73*a* in the base 3.

It should be noted that the position where the identification code is disposed is not limited thereto, but is sufficiently the position where the electrode is disposed, and can be disposed in, for example, any one of the arm part 4*a*, the arm part 4*c*, and the arm part 4*d*, or can be disposed in any one of the arm parts of the support arm 5. Alternatively, it is possible to dispose the identification code in the arm part 1*a*, the weight part 1*b* of the vibrating arm 1 or the arm part 2*a*, the weight part 2*b* of the vibrating arm 2. It should be noted that when providing the identification code to the vibrating arms 1, 2, it is preferable to adopt a design of taking a weight variation due to the identification code into consideration such as disposing a pair of identification codes at symmetric positions of the vibrating arms 1, 2 to thereby adopt setting so that a desired vibration can be obtained within an adjustable range by metal films in the weight parts 1*b*, 2*b*.

Going back to FIG. 4, although there is presented the description assuming that the seven identification symbols are arranged in a line in the identification code 20, it is possible for the seven identification symbols to adopt a regular zigzag arrangement. When adopting the zigzag arrangement, it is possible to shorten the length of the identification code.

Further, although in the above description, it is assumed that the identification symbols 10*a*, 10*b* are formed using a photolithography method, this is not a limitation, it is sufficient to adopt a method capable of removing the extraction electrode 74 to achieve patterning, and it is possible to form the identification symbols 10*a*, 10*b* using, for example, laser processing.

As described hereinabove, according to the vibration element 50 and the vibrator device 100 in the present embodiment, the following advantages can be obtained.

The vibration element 50 has the vibrating arms 1, 2 as the vibrating part, the base 3 and the support arms 4, 5 as the support part which is coupled to the vibrating arms 1, 2, and supports the vibrating arms 1, 2, the excitation electrodes 71, 72 provided to the vibrating arms 1, 2, and the electrodes including the extraction electrode 74 as the support part electrode provided to the support arm 4, and the extraction electrode 74 is provided with the identification code 20.

Since the identification code 20 is an arrangement of the identification symbols 10a, 10b formed of the reverse patterns each having a simple circular shape, even when making the identification code 20 smaller, a deformation or a blur which occurs in numerals of the related-art identification code is little, and therefore, the identification code 20 can easily be discriminated. Further, it is possible to provide the identification code 20 also to the support arm 4 small in width in the resonator unit 50 small in size without requiring the square space which is required for the two-dimensional code. Further, the identification symbols are capable of performing the expression by a binary number or a ternary number, and is therefore capable of dealing with necessary amounts of information.

Therefore, it is possible to provide the vibration element 50 and the vibrator device 100 each provided with the identification code 20 which can be formed in a small space, and which is easy to discriminate.

Further, the identification code 20 includes the identification symbols 10a, 10b of patterns reversed from each other, and can also include more than two types of identification symbols.

According to the above, since the contrast becomes clear due to the reverse patterns, it is possible to surely discriminate even the identification symbols 10a, 10b small in size. Further, by using the more than two types of identification symbols, it is possible to describe a large amount of information even with a small number of digits.

Further, the size of the identification symbol 10b is no smaller than 1 μm and no larger than 80 μm, and the gap between the identification symbols adjacent to each other is no smaller than 1 μm and no larger than 150 μm.

According to the above, even in the small space, it is possible to form the identification symbols which can be discriminated, and the identification code the image recognition of which can be achieved.

Further, the base member 40 has the upper surface 40a as the first surface, and the lower surface 40b as the second surface opposed to the first surface, the extraction electrode 74 on the upper surface 40a is provided with the identification symbol 10b, and in a portion of the lower surface 40b overlapping the identification symbol 10b on the upper surface 40a, there is disposed the opening 10c, but no electrode is disposed.

According to the above, since it becomes possible to use the identification symbol 10b without the opening 10c and the identification symbol 10b with the opening 10c as the identification symbols different from each other, it becomes possible to describe a ternary number.

Further, in the preferred example, the identification code 20 is provided to the extraction electrode 73a in the base 3, or the extraction electrode 74 in the support arm 4.

According to the above, since the identification code 20 is provided to the extraction electrode 74 in the support arm 4 instead of the vibrating arms 1, 2, it is possible to decrease the frequency deviation due to the formation of the identification code 20, and thus, it is possible to obtain the vibration element 50 high in accuracy.

Embodiment 2

Different Aspect-1 of Identification Code

Figures 9, 10:
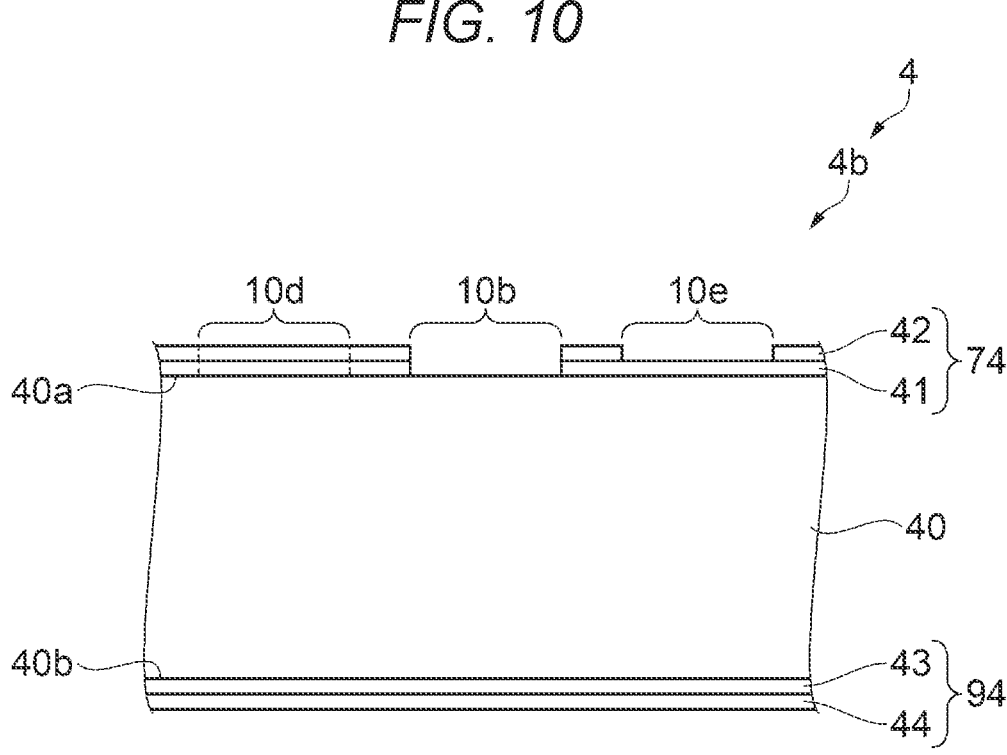
FIG. 9 is a plan view of an identification code related to Embodiment 2.
FIG. 10 is a cross-sectional view of an aspect in a d-d cross-section in FIG. 9.

FIG. 9 is a plan view of an identification code according to the present embodiment, and corresponds to FIG. 7. FIG. 10 is a cross-sectional view along a d-d cross-section in FIG. 9.

The identification code 22 in the present embodiment is different in the point that it is possible to express ternary numbers with the stacked structure of the upper surface 41a, and the formation method thereof from that in Embodiment 1. Hereinafter, the same constituent regions as in Embodiment 1 are denoted by the same reference numerals, and redundant descriptions will be omitted.

In the identification code 22 shown in FIG. 9, three gray levels can be expressed by an identification symbol 10e formed of the surface of the foundation electrode 41 in the extraction electrode 74 as shown in FIG. 10 in addition to the identification symbol 10d formed of the unpatterned surface of the extraction electrode 74, and the identification symbol 10b formed of the surface of the base member 40 from which the electrode is removed. For example, by the identification symbol 10d representing "0," the identification symbol 10b representing "1," and the identification symbol 10e representing "2," it is possible to express ternary numbers. It should be noted that it is possible for the identification symbol 10e to represent "1," and it is possible for the identification symbol 10b to represent "2," and it is sufficient to arbitrarily set the association with the numerals.

Method of Forming Identification Code

Figure 11:
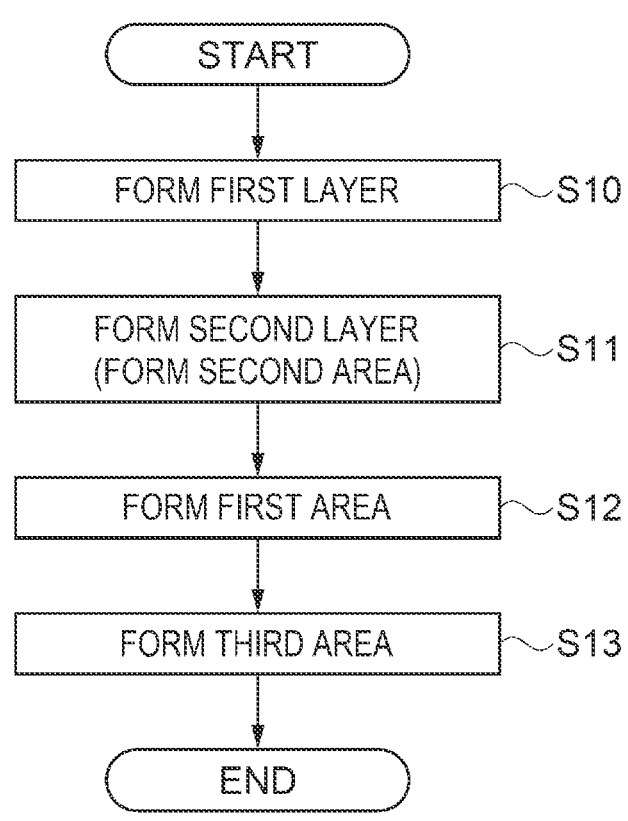
FIG. 11 is a flowchart of a method of manufacturing the identification code.
Figure 12:
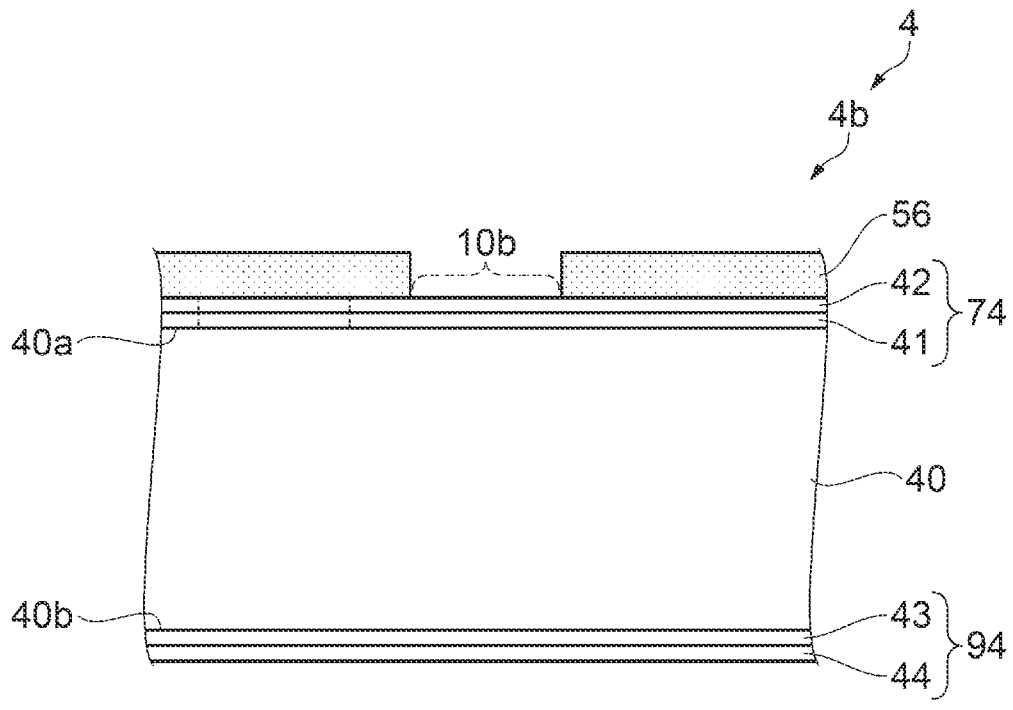
FIG. 12 is a manufacturing process diagram in the d-d cross-section in FIG. 9.
Figures 13, 14:
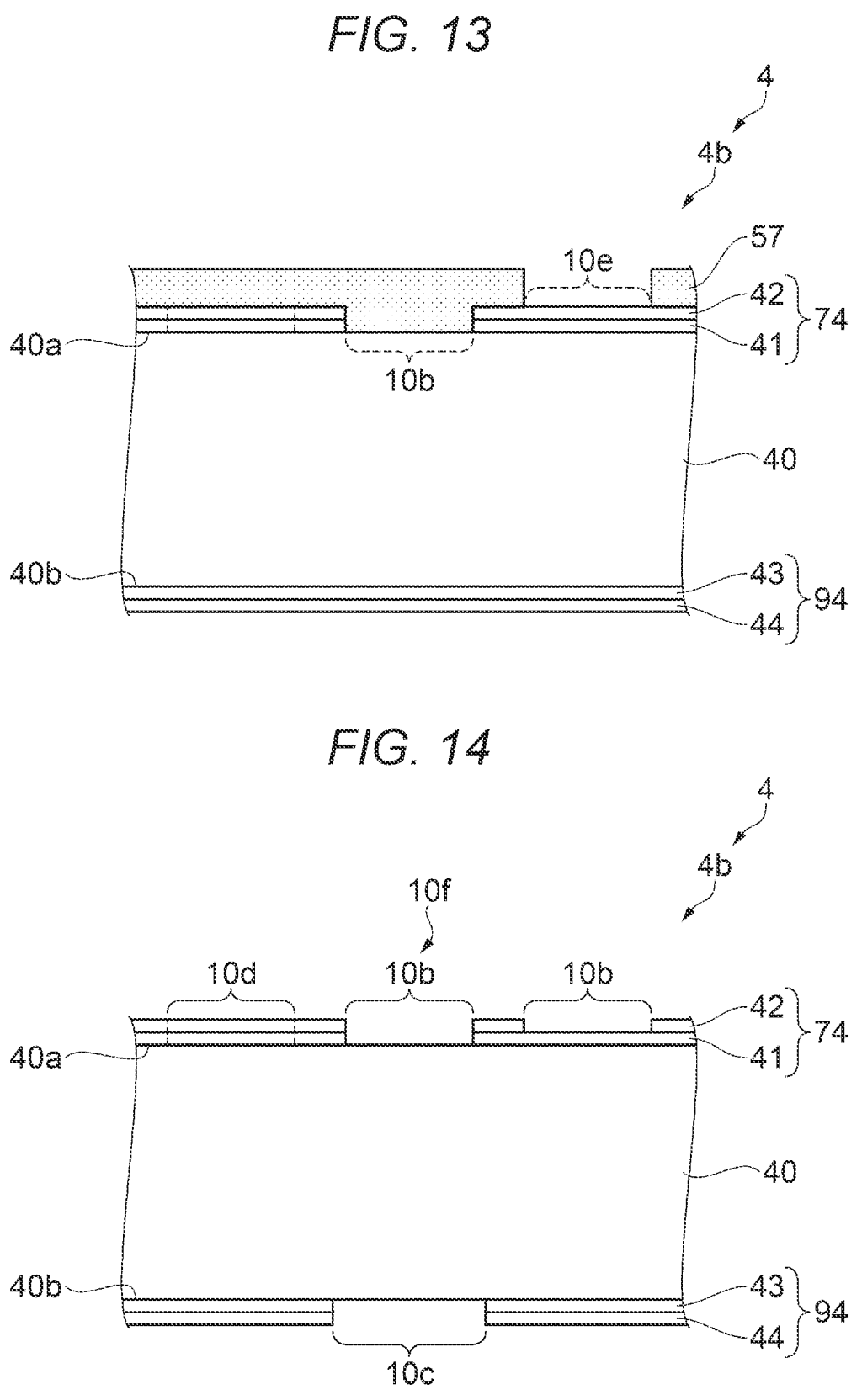

FIG. 11 is a flowchart showing a flow of the method of forming the identification code. FIG. 12 and FIG. 13 are manufacturing process diagrams.

Then, the method of forming the identification code 22 will be described using mainly FIG. 11 and arbitrarily FIG. 12 and FIG. 13.

In the step S10, the foundation electrode 41 to be a first layer of the extraction electrode 74 is formed on the upper surface 40a of the base member 40. In detail, the foundation electrode 41 is formed using an evaporation method. In the preferred example, chromium is used as a material of the foundation electrode 41. It should be noted that chromium is not a limitation, and it is possible to use other materials described above. In other words, the foundation electrode 41 to be the foundation layer is formed on the upper surface 40a as the first surface of the base member 40.

In the step S11, the upper electrode 42 to be a second layer of the extraction electrode 74 is formed on the foundation electrode 41. In detail, the upper electrode 42 is formed using an evaporation method. Thus, as shown in FIG. 12, the extraction electrode 74 having a two-layer configuration is formed on the upper surface 40a of the base member 40. In the preferred example, gold is used as a material of the upper electrode 42. It should be noted that gold is not a limitation, and it is possible to use other materials described above. In other words, the upper electrode 42 as a second layer is stacked on the foundation electrode 41 as the first layer to form a second area formed of the extraction electrode 74 as the electrode.

In the step S12, as shown in FIG. 12, on the extraction electrode 74, there is formed a resist 56 in which portions to be the identification symbols 10b are opened. Subsequently, by performing etching processing using the resist 56 as a mask, the extraction electrode 74 is removed from the portions to be the identification symbols 10*b*. In other words, the extraction electrode 74 is removed to thereby form the first area where the surface of the base member 40 is exposed.

In the step S13, as shown in FIG. 13, on the extraction electrode 74 and the identification symbols 10*b*, there is formed a resist 57 in which portions to be the identification symbols 10*e* are opened. Subsequently, by performing etching processing using the resist 57 as a mask, the upper electrode 42 is removed from the portions to be the identification symbols 10*e*. In detail, the etching rate is controlled to selectively remove only the upper electrode 42. In other words, the upper electrode 42 as the second layer is removed from the extraction electrode 74 to form a third area where the foundation electrode 41 as the first layer is exposed. It should be noted that it is possible to use laser processing for the formation of the identification symbols 10*b* and the identification symbols 10*e*. When forming the identification symbols 10*e* using the laser processing, it is preferable to control the irradiation intensity to be lower than in the formation of the identification symbols 10*b* so as to selectively remove only the upper electrode 42.

Going back to FIG. 10, thus, there are formed the identification symbol 10*d* as the second area formed of the surface of the extraction electrode 74 obtained by stacking the upper electrode 42 as the second layer on the foundation electrode 41 as the first layer, the identification symbol 10*b* as the first area formed of the surface of the base member 40, and the identification symbol 10*e* as the third area formed of the surface of the foundation electrode 41 as shown in FIG. 10. In the preferred example, the identification symbol 10*e* has a chromium surface which is different in color tone, reflectance, and so on from a gold surface of the identification symbol 10*d* and a quartz crystal material surface of the identification symbol 10*b* to create a contrast, and can therefore be clearly discriminated due to the contrast.

The identification code 22 shown in FIG. 9 represents "0120120" as a ternary number, which represents 420 as a decimal number. As described above, in the identification code 22, it is possible to describe identification codes from 0 to 2186. It should be noted that the seven digits are not a limitation, but it is possible to arbitrarily set the number of digits in accordance with a necessary amount of information. In other words, the identification code 22 is formed of an arrangement of two or more identification symbols including the identification symbol 10*b* using the first area, the identification symbol 10*d* using the second area, and the identification symbol 10*e* using the third area.

Different Aspect-2 of Identification Code

FIG. 14 is a cross-sectional view of an identification code according to the present embodiment, and corresponds to FIG. 10.

In FIG. 14, the three gray levels are realized by using an identification symbol 10*f* using the opening 10*c* on the lower surface 40*b*. In detail, in the identification symbol 10*f*, the opening 10*c* is provided to the extraction electrode 94 at the lower surface 40*b* side of the base member 40 at a reverse side of the identification symbol 10*b*. In other words, on the lower surface 40*b* as the second surface of the base member 40, there is disposed the extraction electrode 94 as a second electrode, the extraction electrode 94 includes the foundation electrode 43 as a third layer which is the foundation layer and the upper electrode 44 as a fourth layer which is an upper layer of the third layer, and when performing zoning into the opening 10*c* as a fourth area where the extraction electrode 94 is not disposed and a fifth area where the foundation electrode 43 and the upper electrode 44 are stacked on one another, the identification symbol 10*f* is formed of the identification symbol 10*b* as the first area and the opening 10*c* overlapping each other.

Thus, when performing a see-through observation of the identification symbol 10*f* from the upper surface 40*a* side, since no electrode exists on the lower surface 40*b* side of the base member 40 having a light transmissive property, the color tone, the reflectance, and so on are different compared to the identification symbol 10*b* in which the extraction electrode 74 is observed via the base member 40 when performing the see-through observation, and therefore, a contrast occurs to make it possible to clearly discriminate between the identification symbol 10*f* and the identification symbol 10*b*. It should be noted that the identification symbol 10*f* can be formed by a combination of the formation methods described above.

Figure 15:
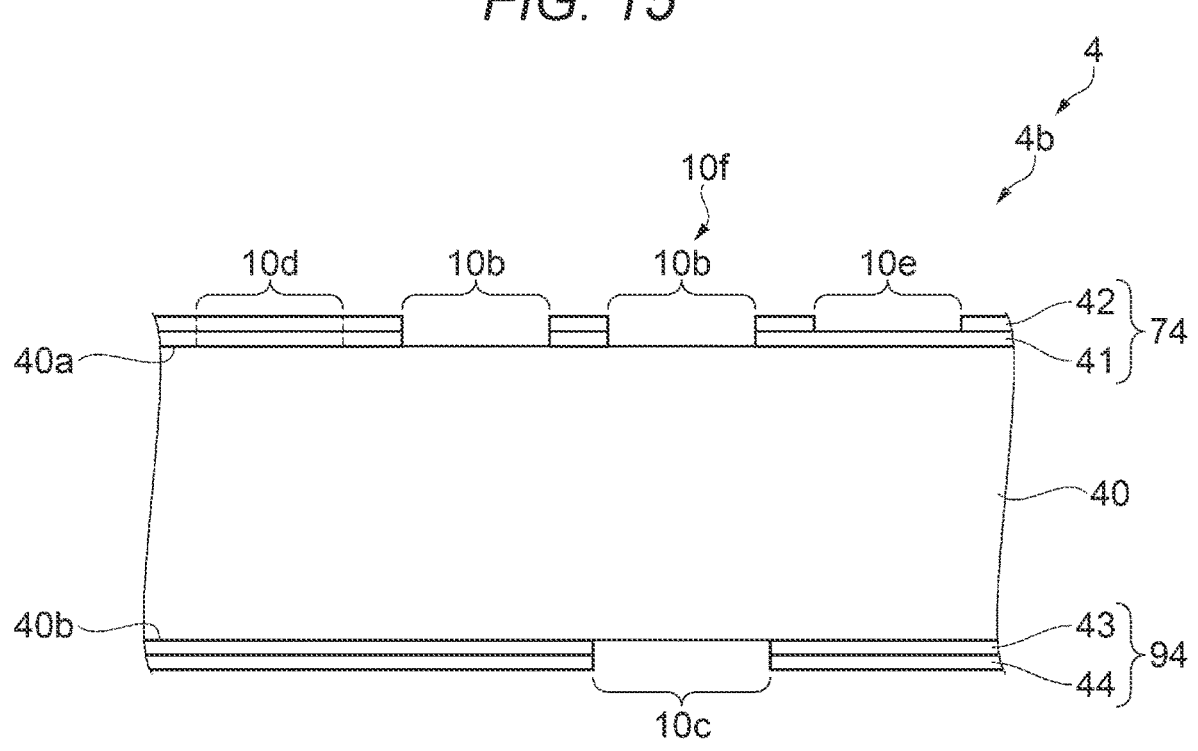
FIG. 15 is a cross-sectional view of the identification symbol in the modified example.

FIG. 15 is a cross-sectional view of an identification code according to the present embodiment, and corresponds to FIG. 10 and FIG. 14.

FIG. 15 shows the identification code of four gray levels obtained by combining the identification symbols shown in FIG. 10 and FIG. 14. In detail, there are arranged the identification symbol 10*d*, the identification symbol 10*b*, the identification symbol 10*f*, and the identification symbol 10*e* in this order from the left side. According to the above, it is possible to describe 256 types of identification codes with these four digits. Further, in the case of seven digits, it is possible to describe 16384 types of identification codes.

As described hereinabove, according to the vibration element 50 and the vibrator device 100 in the present embodiment, the following advantages can be obtained in addition to the advantages in Embodiment 1.

The vibration element 50 is provided with the vibrating arms 1, 2 as the vibrating part, and the base 3 as the support part which is coupled to the vibrating arms 1, 2 and supports the vibrating arms 1, 2, the base member 40 constituting the vibrating arms 1, 2 and the base 3 has the upper surface 40*a* as the first surface and the lower surface 40*b* as the second surface opposed to the upper surface 40*a*, on the upper surface 40*a*, there is disposed the extraction electrode 74 as the first electrode, the extraction electrode 74 includes the foundation electrode 41 as the first layer which is the foundation layer, and the upper electrode 42 as the second layer which is an upper layer of the first layer, and when performing zoning into the first area where the extraction electrode 74 is not disposed, the second area where the foundation electrode 41 and the upper electrode 42 are stacked on one another, and the third area where the foundation electrode 41 is formed, there are formed the identification symbols using two or more areas out of the first through third areas, and there is provided the identification code 22 constituted by the plurality of identification symbols.

According to the above, in the extraction electrode 74 located at the upper surface 40*a* side, using the three areas different in gray level from each other, namely the first area where the surface of the base member 40 made of quartz crystal is exposed, the second area as the surface of the extraction electrode 74, and the third area as the surface of the foundation electrode 41, it is possible to separately create the identification symbol 10*b*, the identification symbol 10*d*, and the identification symbol 10*e*. Therefore, it is possible to form the identification code 22 of three gray levels only with the upper surface 40*a* side of the base member 40. Further, the formation method is also simple.

Therefore, it is possible to provide the vibration element 50 provided with the identification code which can be formed in a small space, and which is easy to discriminate. Further, it is possible to provide the manufacturing method of easily forming the identification code easy to discriminate.

Further, on the lower surface 40*b* as the second surface of the base member 40, there is disposed the extraction electrode 94 as the second electrode, the extraction electrode 94 includes the foundation electrode 43 as the third layer which is the foundation layer and the upper electrode 44 as the fourth layer which is an upper layer of the third layer, and when performing zoning into the opening 10*c* as the fourth area where the extraction electrode 94 is not disposed and the fifth area where the foundation electrode 43 and the upper electrode 44 are stacked on one another, the identification symbol 10*f* is formed of the identification symbol 10*b* as the first area and the opening 10*c* overlapping each other.

According to the above, when performing the see-through observation of the identification symbol 10*f* from the upper surface 40*a* side, since no electrode exists on the lower surface 40*b* side of the base member 40 having a light transmissive property, the color tone, the reflectance, and so on are different compared to the identification symbol 10*b* in which the extraction electrode 74 is observed via the base member 40 when performing the see-through observation, and therefore, a contrast occurs to make it possible to clearly discriminate between the identification symbol 10*f* and the identification symbol 10*b*.

Therefore, by combining the lower surface 40*b* of the base member 40, it becomes possible to form the identification symbols of four gray levels, and thus, it is possible to increase the amount of information.

The method of manufacturing the vibration element 50 includes a step which includes a step of forming the foundation electrode 41 as the first layer to be the foundation layer on the upper surface 40*a* of the base member 40, a step of stacking the upper electrode 42 as the second layer on the foundation electrode 41 to form the second area formed of the extraction electrode 74, a step of forming the identification symbol 10*b* using the first area where the extraction electrode 74 is removed, and a step of forming the third area where the upper electrode 42 is removed from the extraction electrode 74 to expose the foundation electrode 41, and which forms the identification code obtained by arranging the identification symbols constituted by two or more of the first through third areas.

According to the above, it is possible to provide the manufacturing method capable of easily forming the identification code easy to discriminate.

Embodiment 3

Different Aspect of Identification Symbol

Figure 16:
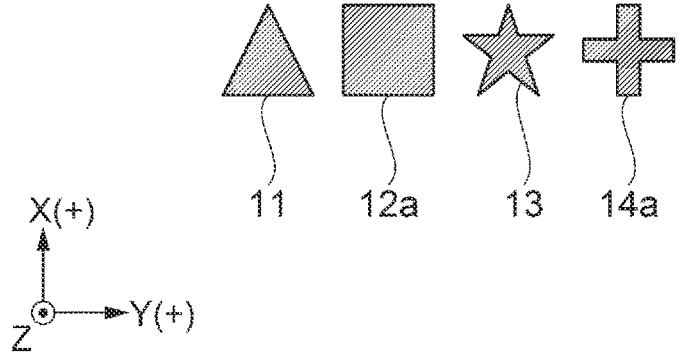
FIG. 16 is a plan view of an identification symbol related to Embodiment 3.

FIG. 16 is a plan view of identification symbols according to the present embodiment, and corresponds to FIG. 4, FIG. 7, and FIG. 9.

In each of the embodiments described above, the description is presented assuming that the shape of the identification symbol is a circular shape, but this is not a limitation, and it is sufficient for the identification symbol to have a shape easy to discriminate. Hereinafter, the same constituent regions as in Embodiment 1 are denoted by the same reference numerals, and redundant descriptions will be omitted.

As shown in FIG. 16, an identification symbol 11 has a triangular shape, and an identification symbol 12*a* has a quadrangular shape. It should be noted that it is also possible to use other polygonal shapes. Further, an identification symbol 13 has a star shape, and an identification symbol 14*a* has a crisscross shape. As described above, as the identification symbol, there can be used a variety of shape patterns easy to discriminate. Further, similarly to the identification symbol 10*a* (FIG. 4), it is possible to use reverse patterns obtained by etching only the outlines of these identification symbols. It is possible to describe quaternary numbers in four digits with the identification symbols shown in FIG. 16. Further, when adding the circular pattern of the identification symbol 10*b* (FIG. 4) thereto, it becomes possible to describe quinary numbers in five digits.

FIG. 17 through FIG. 20 are plan views of identification symbols according to the present embodiment, and each correspond to FIG. 16.

Figure 17:
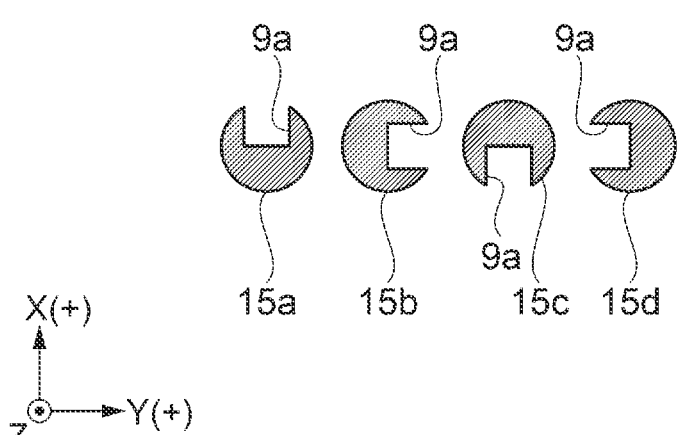
FIG. 17 is a plan view showing an aspect of an identification symbol.

Identification symbols 15 shown in FIG. 17 are identification symbols including a direction pointer 9*a* indicating a direction of the identification symbol. The identification symbols 15 each form a circular shape, and a part of the circular shape is cut out to open with the direction pointer 9*a* having a rectangular shape. It should be noted that in FIG. 17, a suffix is attached to the reference numeral in accordance with the orientation of the direction pointer 9*a*.

In an identification symbol 15*a*, the direction pointer 9*a* is directed toward the positive X direction. In an identification symbol 15*b*, the direction pointer 9*a* is directed toward the positive Y direction. In an identification symbol 15*c*, the direction pointer 9*a* is directed toward the negative X direction. In an identification symbol 15*d*, the direction pointer 9*a* is directed toward the negative Y direction. In other words, with reference to the identification symbol 15*a*, the identification symbol 15*b* rotates clockwise as much as 90°, the identification symbol 15*c* rotates as much as 180°, and the identification symbol 15*d* is directed toward the direction rotated as much as 270°. In other words, assuming the arrangement direction of the identification symbols as the positive Y direction as a first direction, the identification code includes the identification symbol having the direction pointer 9*a* directed toward the first direction or the direction pointer 9*a* directed toward a direction different from the first direction.

Figure 18:
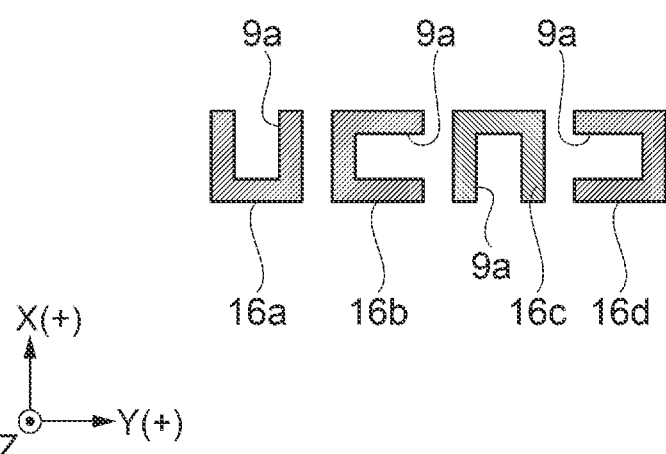
FIG. 18 is a plan view showing an aspect of an identification symbol.

Identification symbols 16 shown in FIG. 18 each form a quadrangular shape, and a part of the quadrangular shape is cut out to open with the direction pointer 9*a* having a rectangular shape. In an identification symbol 16*a*, the direction pointer 9*a* is directed toward the positive X direction. In an identification symbol 16*b*, the direction pointer 9*a* is directed toward the positive Y direction. In an identification symbol 16*c*, the direction pointer 9*a* is directed toward the negative X direction. In an identification symbol 16*d*, the direction pointer 9*a* is directed toward the negative Y direction. In other words, with reference to the identification symbol 16*a*, the identification symbol 16*b* rotates clockwise as much as 90°, the identification symbol 16*c* rotates as much as 180°, and the identification symbol 16*d* is directed toward the direction rotated as much as 270°. It should be noted that the shape of the direction pointer 9*a* is not limited to the rectangular shape, and is only required to be a shape opening direction of which can be identified, and can be, for example, a V shape or can also be a U shape.

Figure 19:
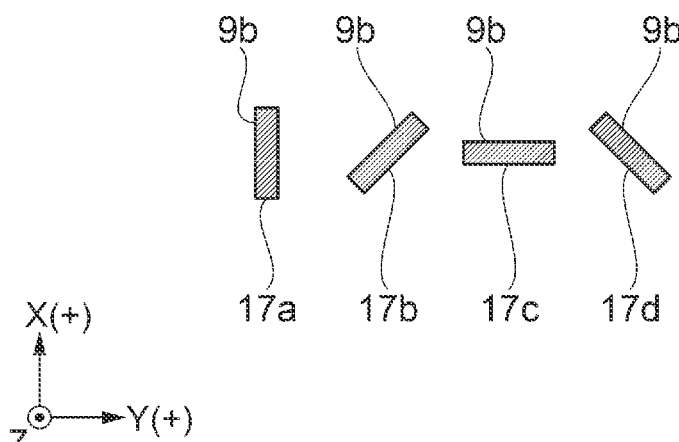
FIG. 19 is a plan view showing an aspect of an identification symbol.

Identification symbols 17 shown in FIG. 19 are each a rod-like rectangular shape, and one side of the rectangular shape plays a role of a direction pointer 9*b*. As described above, as long as a shape includes a line segment indicating a direction, the shape can be used as the direction pointer. In an identification symbol 17*a*, the direction pointer 9*b* is directed toward the positive X direction. Further, with reference to the identification symbol 17*a*, an identification symbol 17b rotates clockwise as much as 45°, an identification symbol 17c rotates as much as 90°, and an identification symbol 17d is directed toward the direction rotated as much as 135°. As described above, by adjusting the rotational angle in accordance with the shape pattern, it is possible to zone the four identification symbols.

Figure 20:
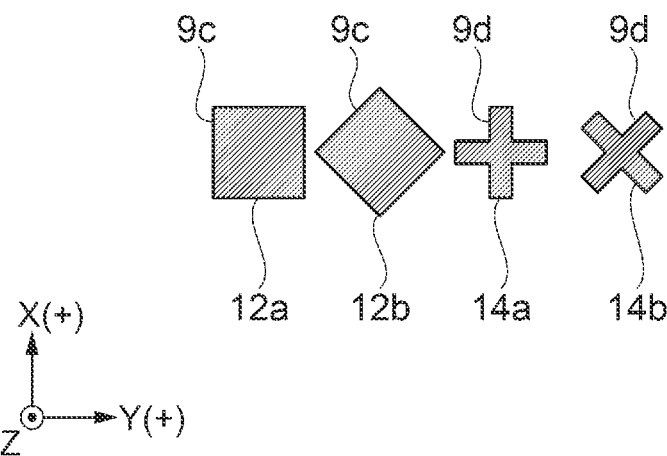
FIG. 20 is a plan view showing an aspect of an identification symbol.

An identification symbol 12b shown in FIG. 20 is obtained by rotating the identification symbol 12a (FIG. 16) clockwise as much as 45°, wherein one side of the quadrangular shape plays the role of a direction pointer 9c. Thus, as shown in FIG. 20, the identification symbol 12b can be discriminated from the identification symbol 12a in which the direction pointer 9c is directed toward the positive X direction. Similarly, an identification symbol 14b is obtained by rotating the identification symbol 14a (FIG. 16) clockwise as much as 45°, wherein one side of the crisscross shape plays the role of a direction pointer 9d. Thus, as shown in FIG. 20, the identification symbol 14b can be discriminated from the identification symbol 14a in which the direction pointer 9d is directed toward the positive X direction.

According to the experiment conducted by the inventors, it is confirmed that the discrimination by the image recognition can be achieved also by these identification symbol 11 through the identification symbol 17.

Further, in the above description, the identification symbols similar in kind are collectively described in each drawing, but it is possible to mix these identification symbols with each other to create the identification code. According to the above, it is possible to describe the identification codes in quaternary or higher number.

Further, in the above description, the description is presented assuming that the base member 40 of the vibration element 50 is the quartz crystal substrate, but this is not a limitation. It is possible to use a variety of types of piezoelectric material such as lithium niobate, lithium tantalate, lead zirconium titanate, lithium tetraborate, langasite, potassium niobate, gallium phosphate, gallium arsenide, aluminum nitride, zinc oxide, barium titanate, lead titanate, sodium potassium niobate, bismuth ferrite, sodium niobate, bismuth titanate, or bismuth sodium titanate, or it is possible to use a material other than the piezoelectric material such as a silicon substrate.

As described hereinabove, according to the vibration element 50 and the vibrator device 100 in the present embodiment, the following advantages can be obtained in addition to the advantages in the embodiments described above.

Assuming the arrangement direction of the identification symbols as the positive Y direction as the first direction, the identification code includes the identification symbol having the direction pointer 9a directed toward the first direction or the direction pointer 9a directed toward a direction different from the first direction.

According to the above, it is possible to discriminate the plurality of identification symbols 15a through 15d from each other using a single identification symbol 15 having the direction pointer 9a by changing the direction of the identification symbol 15. Even the shapes are the same as each other, it is possible to make the identification symbols easy to discriminate by making the directions different using the direction pointer 9a.

Embodiment 4

Application Examples

FIG. 21 through FIG. 26 are each a plan view of the vibration element according to the present embodiment, and correspond to FIG. 3.

The identification code described above can be applied to a variety of vibration elements.

Figure 21:
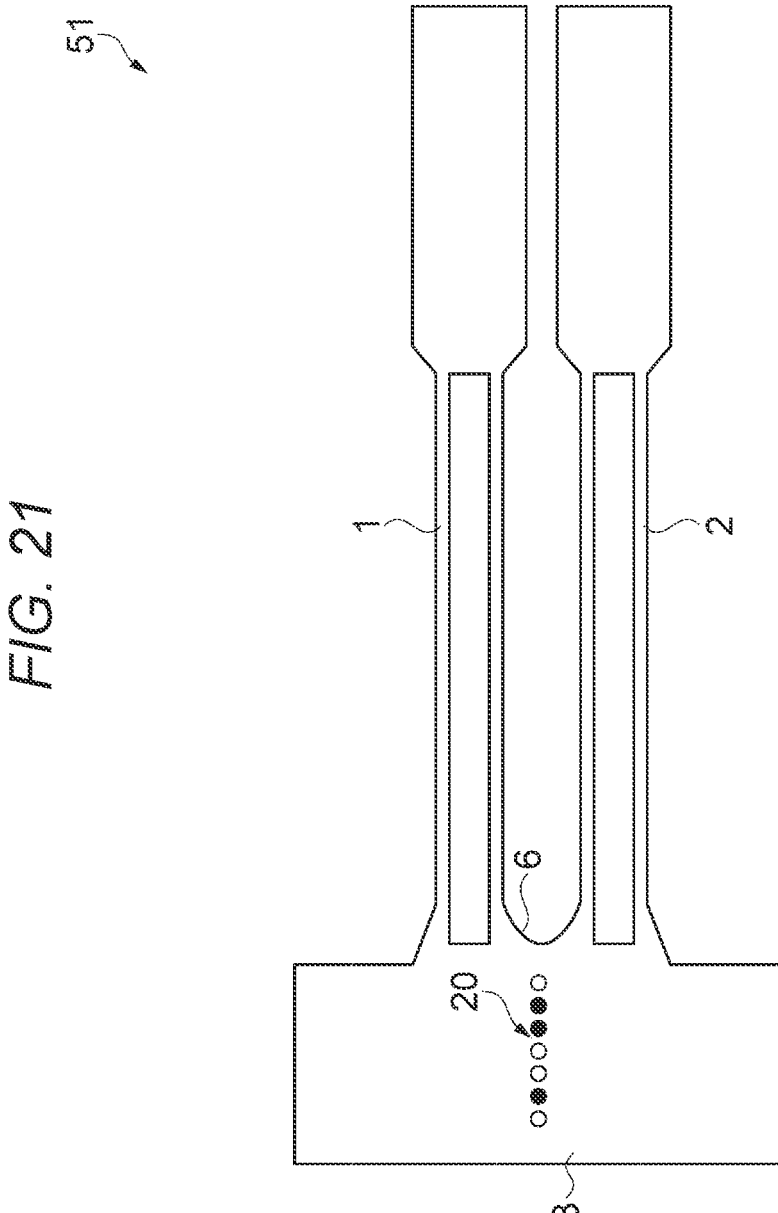
FIG. 21 is a plan view of a vibration element according to Embodiment 4.
Figure 21:
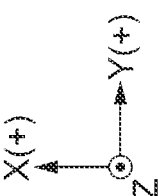

For example, a vibration element 51 shown in FIG. 21 is a tuning-fork vibration element, and has a configuration in which the base 3 is formed to be large in size, and the vibrating arms 1, 2 as the vibrating part are supported by the base 3. Therefore, the support arm is not provided.

As shown in FIG. 21, in the vibration element 51, it is possible to provide the identification code 20 to an electrode such as an extraction electrode of the base 3.

Figure 22:
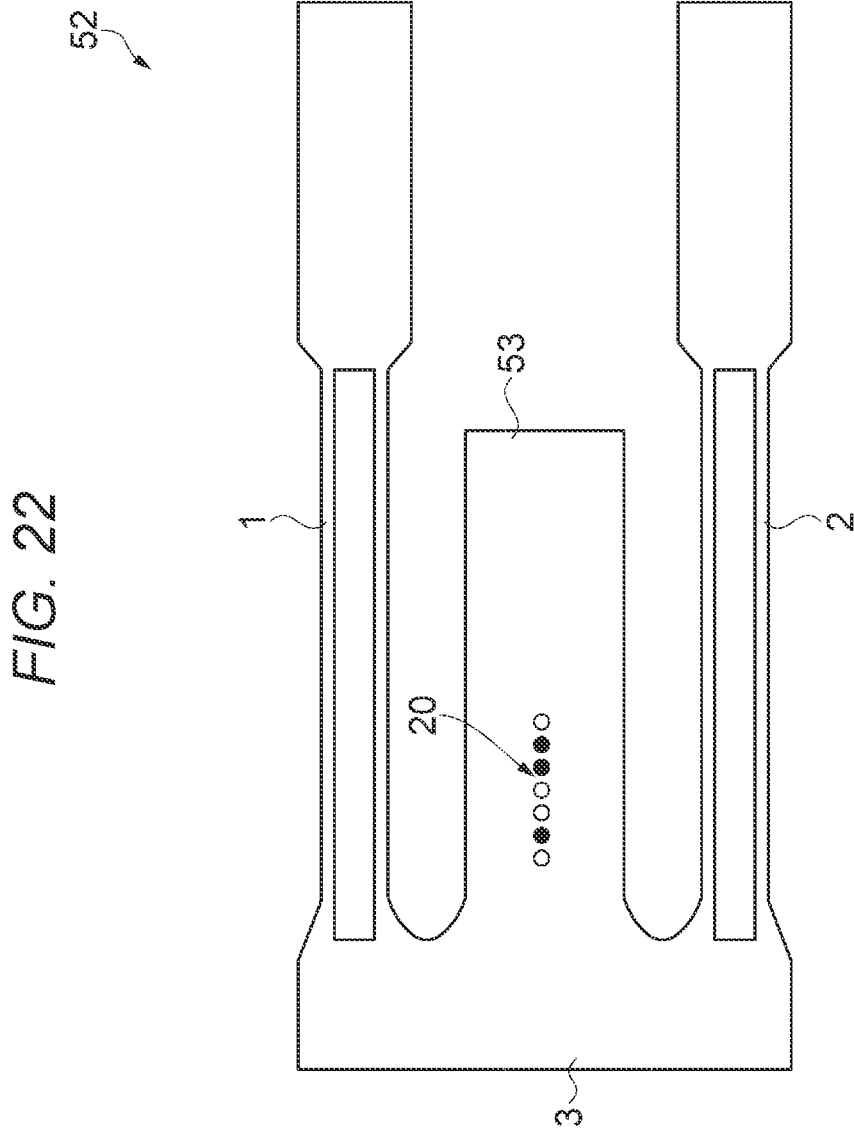
FIG. 22 is a plan view showing an aspect of a vibration element.
Figure 22:
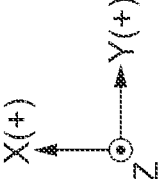

A vibration element 52 shown in FIG. 22 is a tuning-fork vibration element, the distance between the vibrating arms 1, 2 is set long, and a support arm 53 is disposed between the vibrating arms 1, 2. The support arm 53 is coupled to the base 3 similarly to the vibrating arms 1, 2.

As shown in FIG. 22, in the vibration element 52, it is possible to provide the identification code 20 to an electrode such as an extraction electrode of the support arm 53. It should be noted that it is possible to provide the identification code 20 to the base 3.

Figure 23:
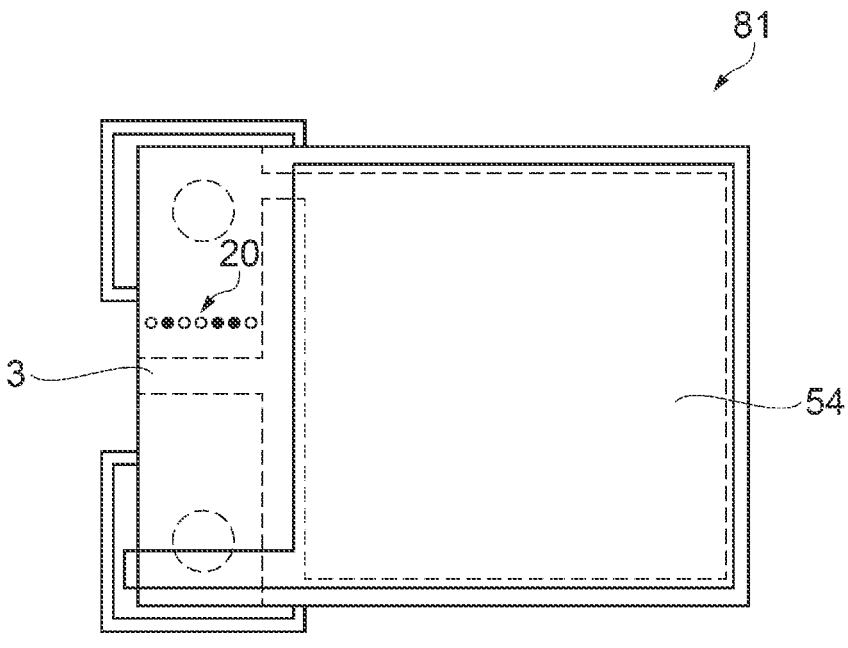
FIG. 23 is a plan view showing an aspect of a vibration element.

A vibration element 81 shown in FIG. 23 is provided with a vibrating part 54 formed of an AT-cut quartz crystal substrate having a thickness-shear vibration mode.

As shown in FIG. 23, in the vibration element 81, it is possible to provide the identification code 20 to an electrode such as an extraction electrode of the base 3.

Figure 24:
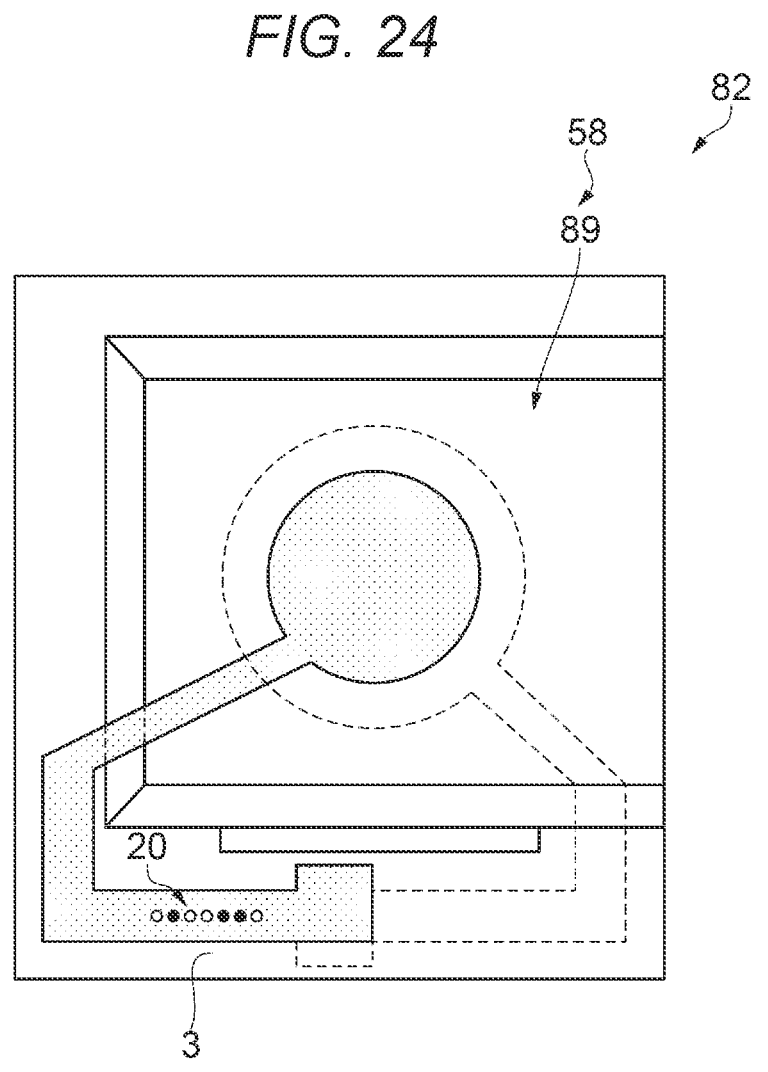

A vibration element 82 shown in FIG. 24 is provided with a vibrating part 58 in the thickness-shear vibration mode having an inverted-mesa structure having a recessed part 89 in substantially the central portion of the quartz crystal substrate.

As shown in FIG. 24, in the vibration element 82, it is possible to provide the identification code 20 to an electrode such as an extraction electrode of the base 3.

A vibration element 83 is a gyro sensor element for respectively detecting angular velocities around three axes (three detection axes) of an x axis, a y axis, and a z axis perpendicular to each other.

The base member of the vibration element 83 is formed of a Z-cut quartz crystal substrate, and has the base 3, a pair of detection arms 852, 853, a pair of coupling arms 854, 855, a pair of drive arms 856, 857, and a pair of drive arms 858, 859, wherein the base 3 is located in a central portion, the pair of detection arms 852, 853 are the vibrating arms extending toward both sides in the Y-axis direction from the base 3, the pair of coupling arms 854, 855 extend toward both sides in the X-axis direction from the base 3, the pair of drive arms 856, 857 are the vibrating arms extending toward both sides in the Y-axis direction from a tip portion of the coupling arm 854, and the pair of drive arms 858, 859 are the vibrating arms extending toward the both sides in the Y-axis direction from a tip portion of the coupling arm 855.

Figure 25:
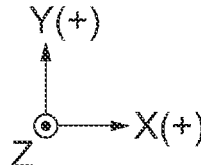
FIG. 25 is a plan view showing an aspect of a vibration element.

As shown in FIG. 25, in the vibration element 83, it is possible to provide the identification code 20 to an electrode such as an extraction electrode of the base 3.

Figure 26:
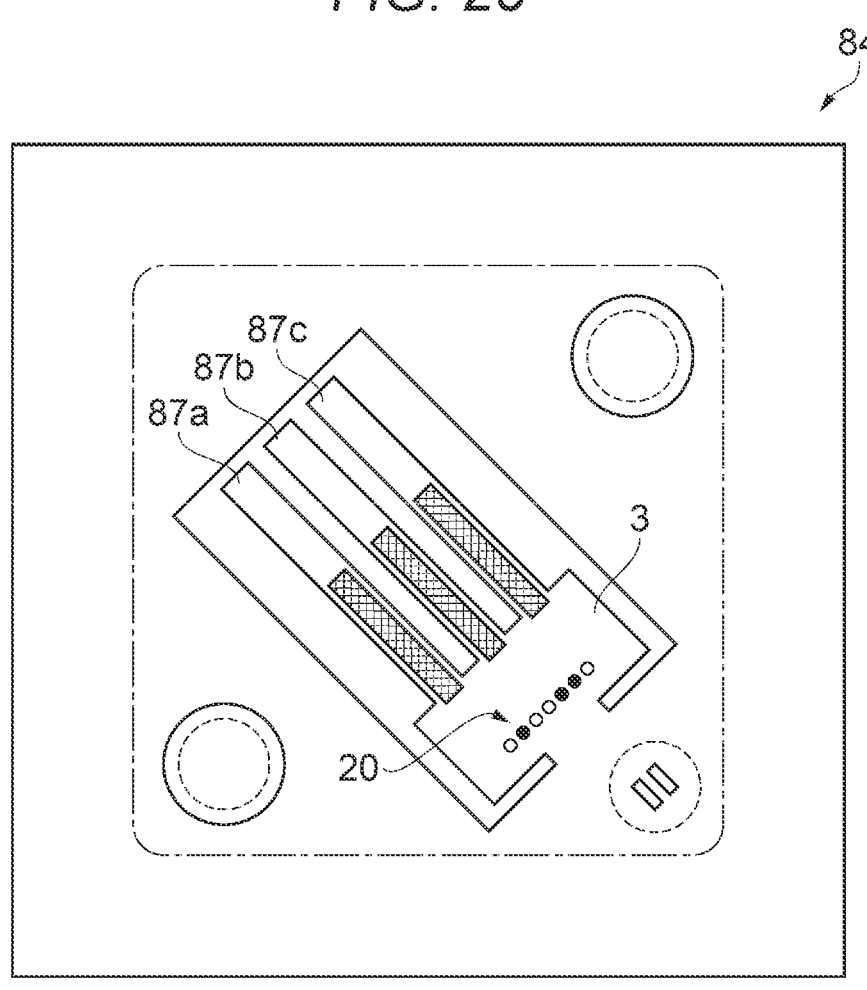
FIG. 26 is a plan view showing an aspect of a vibration element.

A vibration element 84 shown in FIG. 26 is a vibration element using an MEMS (Micro Electro Mechanical Systems) which has three movable parts 87a, 87b, and 87c and the base 3 to which base ends of the movable parts are coupled on an SOI (Silicon on Insulator) substrate.

As shown in FIG. 26, in the vibration element 84, it is possible to provide the identification code 20 to an electrode such as an extraction electrode of the base 3.

What is claimed is:

1. A vibration element comprising:

a vibrating part; and a support part which is coupled to the vibrating part to support the vibrating part, wherein the vibrating part and the support part have a first surface and a second surface having a front and back relationship with the first surface, a first electrode is disposed on the first surface, the first electrode includes a first layer as a foundation layer, and a second layer as an upper layer of the first layer, when performing zoning into a first area in which the first electrode is not disposed, a second area in which the first layer and the second layer are stacked on one another, and a third area in which the first layer is formed, identification symbols formed of two or more of the first area, the second area, and the third area are disposed, and an identification code formed of a plurality of the identification symbols is provided.

2. The vibration element according to claim 1, wherein a second electrode is disposed on the second surface, the second electrode includes a third layer as a foundation layer, and a fourth layer as an upper layer of the third layer, and when performing zoning into a fourth area in which the second electrode is not disposed, and a fifth area in which the third layer and the fourth layer are stacked on one another, the identification code includes the identification symbol formed by the first area and the fourth area overlapping each other.

3. The vibration element according to claim 1, wherein the identification code includes the identification symbols of patterns reversed from each other.

4. The vibration element according to claim 1, wherein defining an arrangement direction of the identification symbols as a first direction, the identification code includes the identification symbol having a direction pointer directed toward the first direction or a direction pointer directed toward a direction different from the first direction.

5. The vibration element according to claim 1, wherein a size of the identification symbol is no smaller than 1 μm and no larger than 80 μm, and a gap between the identification symbols adjacent to each other is no smaller than 1 μm and no larger than 150 μm.

6. The vibration element according to claim 1, wherein the vibrating part includes a pair of vibrating arms, the support part has a base to be coupled to base ends of the pair of vibrating arms, and the identification code is provided to a support part electrode in the base.

7. The vibration element according to claim 1, wherein the vibrating part includes a pair of vibrating arms, the support part has a base to be coupled to base ends of the pair of vibrating arms, and a support arm configured to support the base, and the identification code is provided to a support part electrode in the support arm.

* * * * *